United States Patent
Chen et al.

(10) Patent No.: US 12,009,266 B2
(45) Date of Patent: Jun. 11, 2024

(54) STRUCTURE FOR FRINGING CAPACITANCE CONTROL

(71) Applicant: TAIWAN SEMICONDUCTOR MANUFACTURING CO., LTD., Hsinchu (TW)

(72) Inventors: Keng-Yao Chen, Hsinchu (TW); Chang-Yun Chang, Taipei (TW); Ming-Chang Wen, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/718,316

(22) Filed: Dec. 18, 2019

(65) Prior Publication Data

US 2021/0193530 A1    Jun. 24, 2021

(51) Int. Cl.
| | |
|---|---|
| *H01L 21/8234* | (2006.01) |
| *H01L 21/02* | (2006.01) |
| *H01L 21/762* | (2006.01) |
| *H01L 21/764* | (2006.01) |
| *H01L 27/088* | (2006.01) |

(52) U.S. Cl.
CPC ........ *H01L 21/823481* (2013.01); *H01L 21/76224* (2013.01); *H01L 21/764* (2013.01); *H01L 21/823437* (2013.01); *H01L 27/0886* (2013.01); *H01L 21/02164* (2013.01); *H01L 21/0217* (2013.01); *H01L 21/02274* (2013.01); *H01L 21/0228* (2013.01)

(58) Field of Classification Search
None
See application file for complete search history.

(56) References Cited

U.S. PATENT DOCUMENTS

| | | | | |
|---|---|---|---|---|
| 9,831,346 | B1 * | 11/2017 | Zang | ............. H01L 21/28518 |
| 9,911,736 | B1 | 3/2018 | Zang et al. | |
| 10,014,304 | B2 | 7/2018 | Park et al. | |

(Continued)

FOREIGN PATENT DOCUMENTS

| | | |
|---|---|---|
| KR | 20160056693 A | 5/2016 |
| KR | 20160074859 A | 6/2016 |

(Continued)

OTHER PUBLICATIONS

Taiwan Office Action, dated Aug. 31, 2021, for Taiwan Intellectual Property Office Appl. No. 109143158, 6 pages.

(Continued)

*Primary Examiner* — Asok K Sarkar
(74) *Attorney, Agent, or Firm* — Sterne, Kessler, Goldstein & Fox P.L.L.C.

(57) ABSTRACT

The embodiments described herein are directed to a method for mitigating the fringing capacitances generated by patterned gate structures. The method includes forming a gate structure on fin structures disposed on a substrate; forming an opening in the gate structure to divide the gate structure into a first section and a second section, where the first and second sections are spaced apart by the opening. The method also includes forming a fill structure in the opening, where forming the fill structure includes depositing a silicon nitride liner in the opening to cover sidewall surfaces of the opening and depositing silicon oxide on the silicon nitride liner.

20 Claims, 15 Drawing Sheets

(56) References Cited

U.S. PATENT DOCUMENTS

| | | | |
|---|---|---|---|
| 10,090,169 B1* | 10/2018 | Zang | H01L 21/02362 |
| 10,236,213 B1 | 3/2019 | Pandey et al. | |
| 10,418,284 B2 | 9/2019 | Lee et al. | |
| 10,510,860 B2 | 12/2019 | Lin et al. | |
| 10,535,654 B2 | 1/2020 | Tsai et al. | |
| 11,239,309 B2 | 2/2022 | Wu et al. | |
| 2012/0058639 A1* | 3/2012 | Sim | H01L 21/7681 |
| | | | 438/666 |
| 2016/0133632 A1 | 5/2016 | Park et al. | |
| 2016/0181425 A1 | 6/2016 | Bai et al. | |
| 2017/0053942 A1* | 2/2017 | Doris | H01L 21/26506 |
| 2017/0054002 A1 | 2/2017 | Doris et al. | |
| 2017/0229452 A1 | 8/2017 | Chang et al. | |
| 2018/0286965 A1 | 10/2018 | Zang et al. | |
| 2018/0315853 A1 | 11/2018 | Yu et al. | |
| 2019/0006345 A1 | 1/2019 | Wang et al. | |
| 2019/0148214 A1 | 5/2019 | Chang et al. | |
| 2019/0164809 A1 | 5/2019 | Meyer et al. | |
| 2019/0189521 A1* | 6/2019 | Li | H01L 21/823857 |
| 2019/0363024 A1 | 11/2019 | Yu et al. | |
| 2019/0378903 A1* | 12/2019 | Jeon | H01L 21/823431 |
| 2020/0152504 A1* | 5/2020 | Frougier | H01L 29/4991 |

FOREIGN PATENT DOCUMENTS

| | | |
|---|---|---|
| KR | 20170012640 A | 2/2017 |
| KR | 20190002301 A | 1/2019 |
| KR | 20190024526 A | 3/2019 |
| KR | 20190024626 A | 3/2019 |
| KR | 20190055687 A | 5/2019 |
| TW | 201816856 A | 5/2018 |
| TW | 201926473 A | 7/2019 |
| TW | 201926686 A | 7/2019 |
| TW | 201946226 A | 12/2019 |

OTHER PUBLICATIONS

Korean Office Action, dated Sep. 23, 2021, for Korean Intellectual Property Office Appl. No. 10-2020-0033757, 6 pages.

* cited by examiner

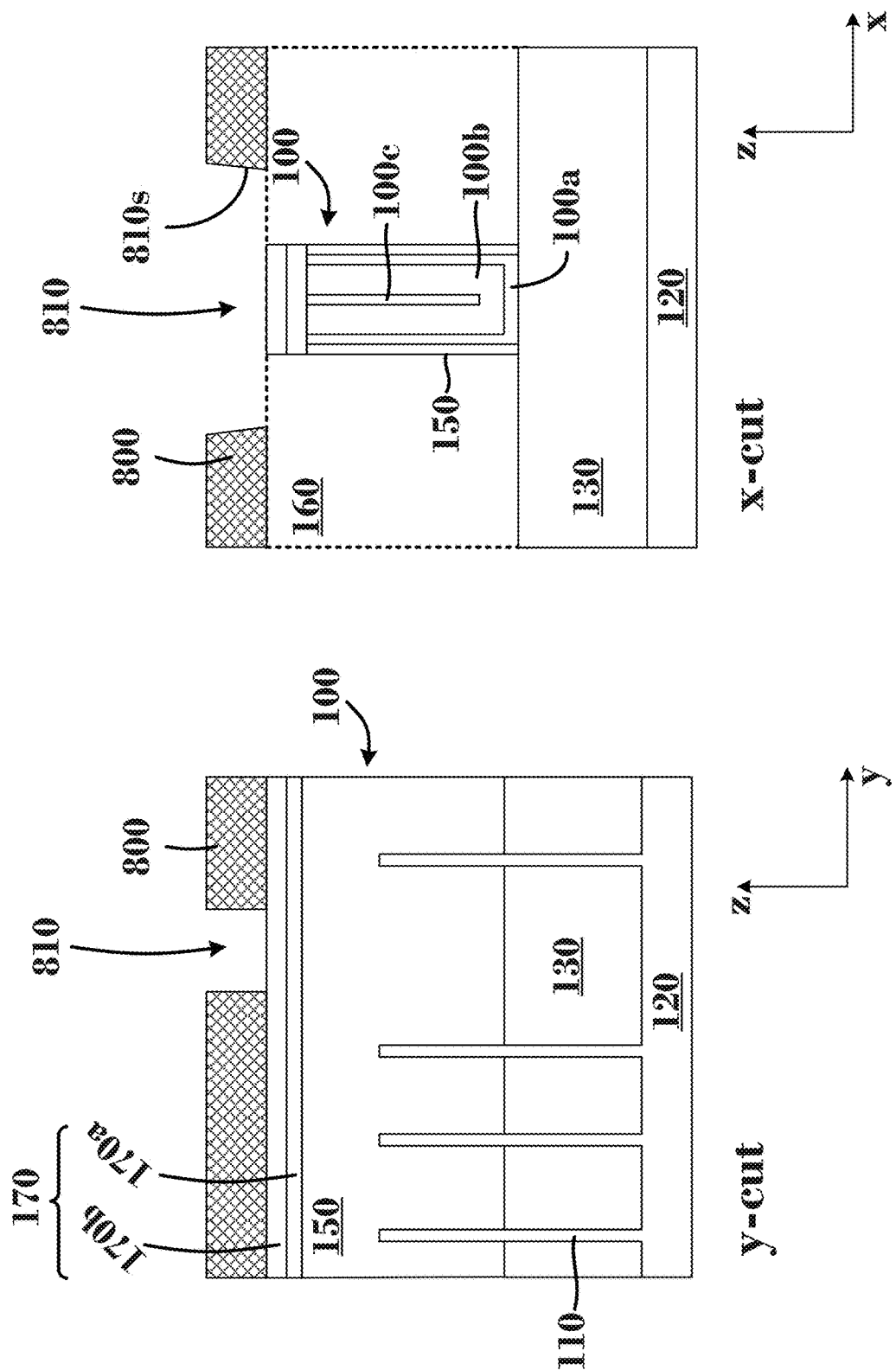

x-cut

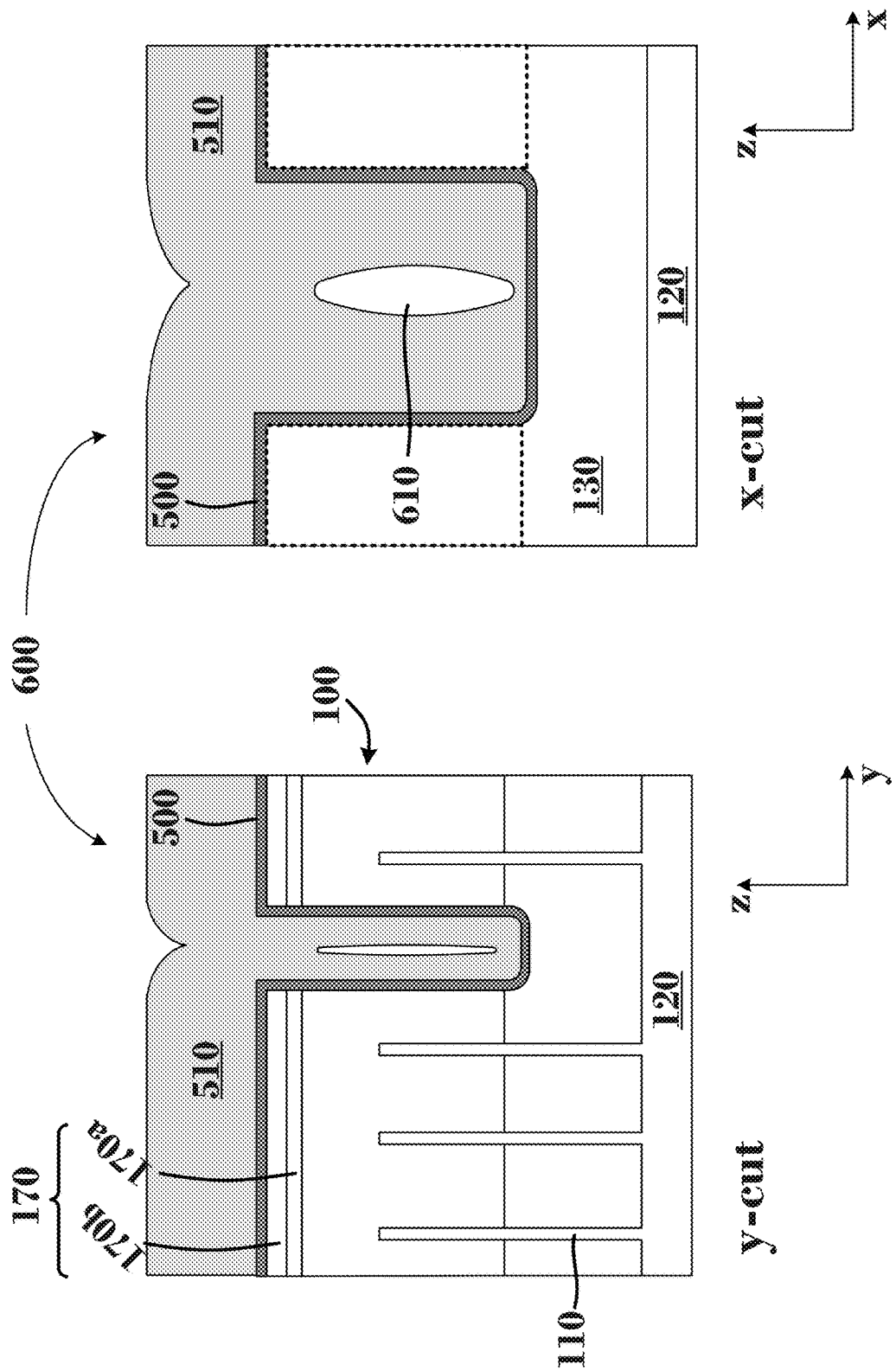
Fig. 12A  y-cut
Fig. 12B  x-cut

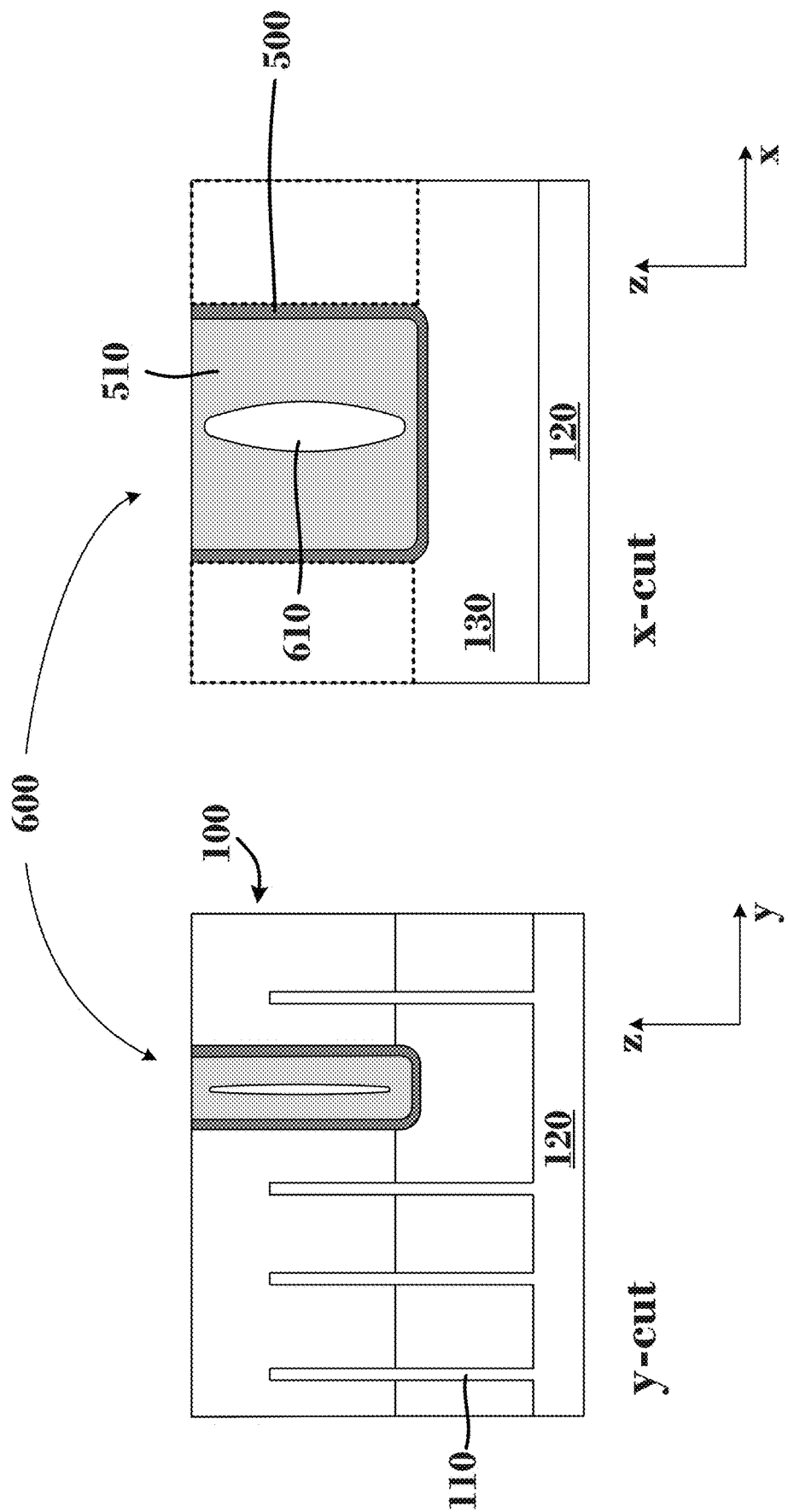

STRUCTURE FOR FRINGING CAPACITANCE CONTROL

BACKGROUND

During the formation of the transistors in an integrated circuit (IC), a long gate structure which is shared between two or more transistors may be patterned to form shorter gate structures. The space formed by the removed portions of the gate structure is subsequently filled with a dielectric material affecting the device performance by undesirable fringing capacitance. For example, the delay time of the ring oscillator.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 8A-B, 9A-C, 10A-B, 11A-B, 12A-B, and 13A-B are cross sectional views describing various processing steps for the formation of a fill structure within a cut that separates a gate structure into two sections, in accordance with some embodiments.

DETAILED DESCRIPTION

Figure 1:
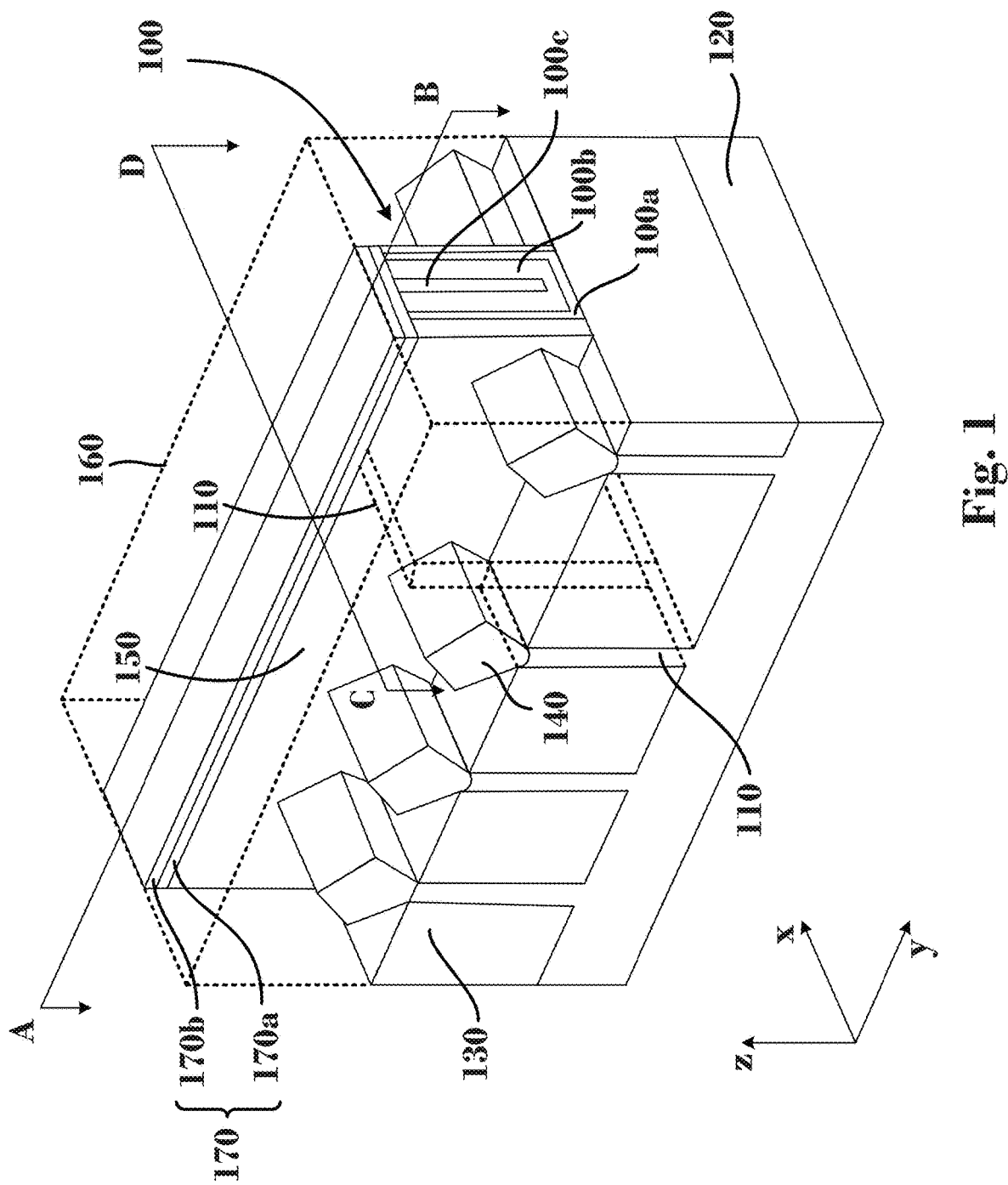
FIGS. 1 and 2 are isometric views of a gate structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

Gate structures in field effect transistor may extend to two or more transistors. For example, the gate structures may be formed as long "lines" across the active regions of the substrate, such as the fins. Once the gate structures are formed, a patterning process "cuts" the long gate structure line to shorter sections according to the desired structure. In other words, the patterning process removes redundant sections of the long gate structure to form one or more "cuts" and separate the long line into to shorter sections. This process may be referred to as a cut-metal-gate (CMG) process. Subsequently, the cuts formed between the separated sections of the gate structure are filled with a dielectric material, such as silicon nitride, which has a dielectric constant higher than about 3.9. Silicon nitride not only electrically isolates the separated gate structure portions, but also protects the exposed gate structure layers from oxygen diffusion.

Since the gate structure is effectively an electrode embedded in one or more dielectric materials, it can form parasitic capacitors—which in turn produce undesirable parasitic capacitances and fringing capacitances in an integrated circuit. The larger the number of cuts formed by the CMG process, the higher the accumulation of fringing capacitances in the IC. The fringing capacitance is further exacerbated by the fact that silicon nitride, which has a dielectric constant (k-value) of about 7.4, is used as a filling material at the end portions (faces) of the patterned gate structure. Fringing capacitances (in addition to other parasitic capacitances present in the vicinity of the gate structure) can adversely impact the IC device performance, such as slow down ring oscillator (RO) circuits and adversely impact the threshold voltage of fabricated transistors.

The embodiments described herein are directed to a method for mitigating the fringing capacitances generated by the patterned gate structures. In some embodiments, the fringing capacitance is reduced by partially replacing the silicon nitride isolation material with a lower-k dielectric. In some embodiments, the deposition of lower-k dielectric is adjusted to allow the formation of seams or air-gaps between the patterned gate structures to further reduce the effective dielectric constant of the formed fill structure. In some embodiments, the dielectric stack is formed by first depositing a silicon nitride liner in the cut, followed by a silicon oxide or a silicon oxide based dielectric fill material (e.g., silicon oxy-carbide) that fills the cut. In some embodiments, the dielectric stack in the cut can include layers in addition to the silicon nitride liner and the dielectric fill material. The silicon oxide or silicon oxide based fill material has a dielectric constant equal to or less than about 3.9, which can substantially reduce the combined dielectric constant of the fill structure (e.g., bring it closer to about 3.9).

Figure 2:
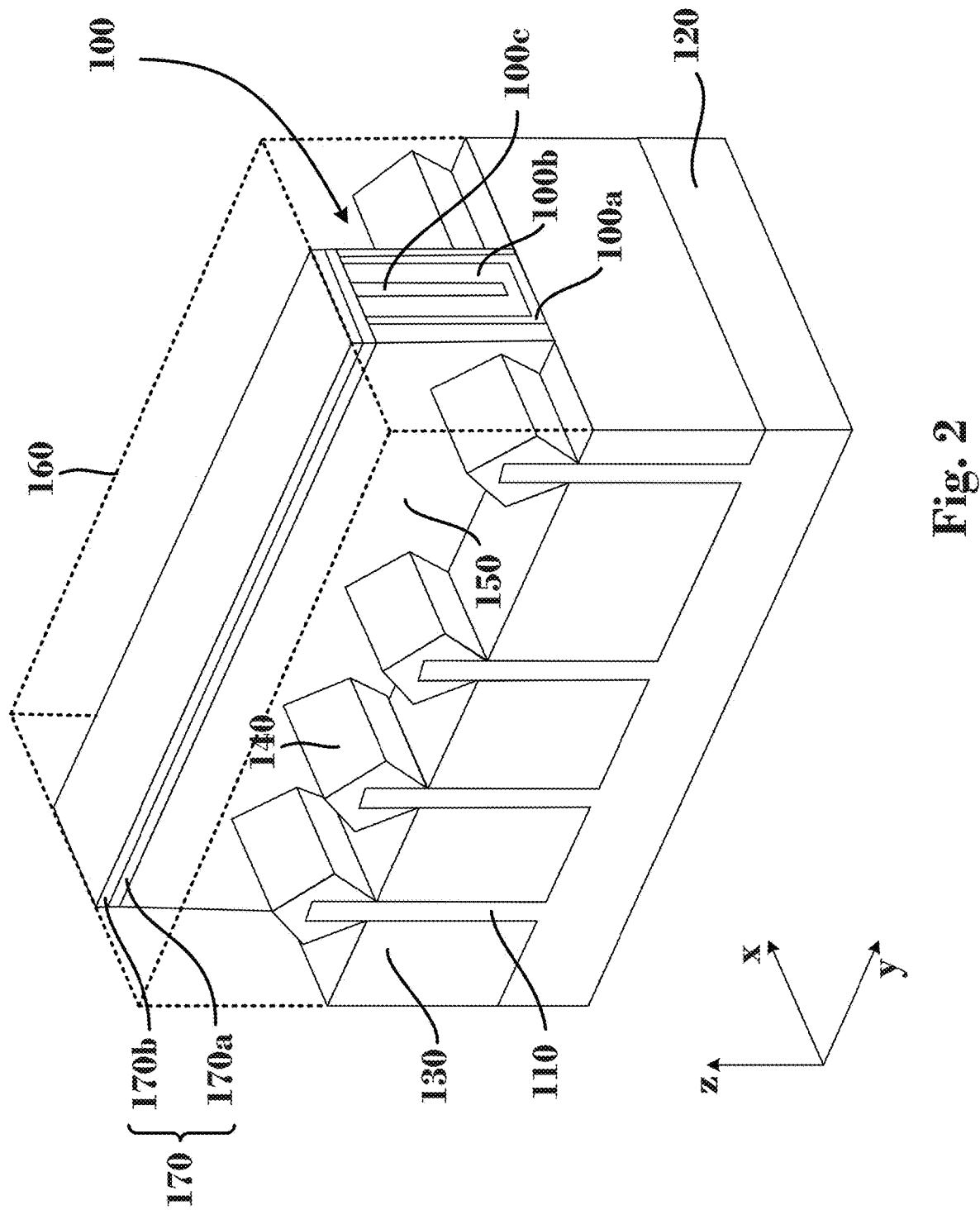

According to some embodiments, FIG. 1 is a partial isometric view of a gate structure 100 formed on fins structures 110, which are disposed on a substrate 120. In some embodiments, gate structure 100 covers top and side surfaces of fin structure 110—which extend length-wise along the x-axis as shown by the dashed lines in FIG. 1. Fin structures 110 can be isolated by a dielectric layer 130. In some embodiments, epitaxial structures 140 are formed on a top surface of recessed portions of fin structures 110 which are not covered by gate structures 100. In alternative embodiments, epitaxial structures 140 can be formed on top and sidewall surfaces of non-recessed fin structures 110 as shown in FIG. 2. In some embodiments, gate structure 100 is isolated from epitaxial structures 140 via gate spacers 150. In referring to FIGS. 1 and 2, gate structure 100 and epitaxial structures 140 are surrounded by a interlayer dielectric (MD) 160 represented by a dashed line for ease of illustration.

In some embodiments, additional gate structures, like gate structure 100, can be formed parallel to gate structure 100 on different fin structures 110. These additional gate structures are not shown in FIG. 1 for simplicity. In some embodiments, FIGS. 1 and 2 show only a portion of an IC structure where the spacing between the fin structures (e.g., the fin pitch), the dimensions of the fin structures, and the dimensions of the gate structures can be similar or different from the ones shown in FIG. 1. Additionally, FIGS. 1 and 2, along with the subsequent figures, are for illustrative purposes only and are not to scale. FIGS. 1 and 2, along with the subsequent figures, may not reflect the actual geometry of the real structures, features, or films. Some structures, films, or geometries may have been deliberately augmented for illustrative purposes.

According to some embodiments, gate structure 100 includes several layers. By way of example and not limitation, gate structure 100 can include a dielectric stack 100a, work function stack 100b, and metal fill 100c, and other intervening layers not shown in FIGS. 1, 2 and the subsequent figures. In some embodiments, a hard mask layer 170 is formed on a top surface of gate structure 100 as shown in FIGS. 1 and 2. Hard mask layer 170 can include a bottom metal nitride layer 170a (e.g., titanium nitride) and a top silicon nitride 170b. According to sonic embodiments, hard mask layer 170 protects gate structure 100 during subsequent operations.

In some embodiments, substrate 120 is a bulk semiconductor wafer or a top layer of a semiconductor on insulator (SOI) wafer such as, for example, silicon on insulator. Further, substrate 120 can be made of silicon (Si) or another elementary semiconductor such as (i) germanium (Ge); (ii) a compound semiconductor including silicon carbide (SiC), gallium arsenide (GaAs), gallium phosphide (GaP), indium phosphide(InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, substrate 120 has a crystalline microstructure—e.g., it is not amorphous or polycrystalline.

Fin structures 110 shown in FIGS. 1 and 2 may be formed on substrate 120 via patterning. For example, fin structures 110 may be patterned using one or more photolithography processes, including double-patterning or multi-patterning processes. Double-patterning or multi-patterning processes can combine photolithography and self-aligned processes, allowing patterns to be created that have, for example, a smaller pitch than what is otherwise obtainable using a single, direct photolithography process. For example, in some embodiments, a sacrificial layer is formed over a substrate (e.g., substrate 120) and patterned using a photolithography process. Spacers are formed alongside the patterned sacrificial layer using a self-aligned process. The sacrificial layer is then removed, and the remaining spacers may then be used to pattern fin structures 110.

In some embodiments, tin structures 110 are made of the same material as substrate 120, or different. By way of example and not limitation, fin structures 110 can be made of Si or another elementary semiconductor such as, for example, (i) Ge; (ii) a compound semiconductor including SiC, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof. In some embodiments, fin structures 110 have a crystalline microstructure e.g., they are not amorphous or polycrystalline.

According to some embodiments, dielectric layer 130 is deposited with a flowable chemical vapor deposition process (e.g., flowable CVD) to ensure that dielectric layer 130 fills the space between fin structures 110 without forming seams or voids. In some embodiments, dielectric layer 130 is a silicon oxide based dielectric that includes, for example, nitrogen and-'or hydrogen. To improve further its dielectric and structural properties, dielectric layer 130 may be subjected to a wet steam anneal (e.g., 100% water molecules) at a temperature between about 800° C. and 1200° C. During the wet steam anneal, dielectric layer 130 densities and its oxygen content may increases.

According to some embodiments, epitaxial structures 140 form the source and drain regions of the fin field effect transistors (FETs). By way of example and not limitation, depending on the type of transistor (e.g., n-type or p-type) epitaxial structures 140 can include: (i) boron (B) doped SiGe, B-doped Ge, or B-doped germanium tin (GeSn) for p-type transistors; and (ii) carbon-doped. Si (Si:C:), phosphorus doped Si (Si:P) or arsenic doped Si (Si:As) for n-type transistors. Further, epitaxial structures 140 may include multiple layers (e.g., two layers, three layers, or more) with different dopant concentration and/or crystalline microstructure, crystallographic orientation, etc.

Figure 3:
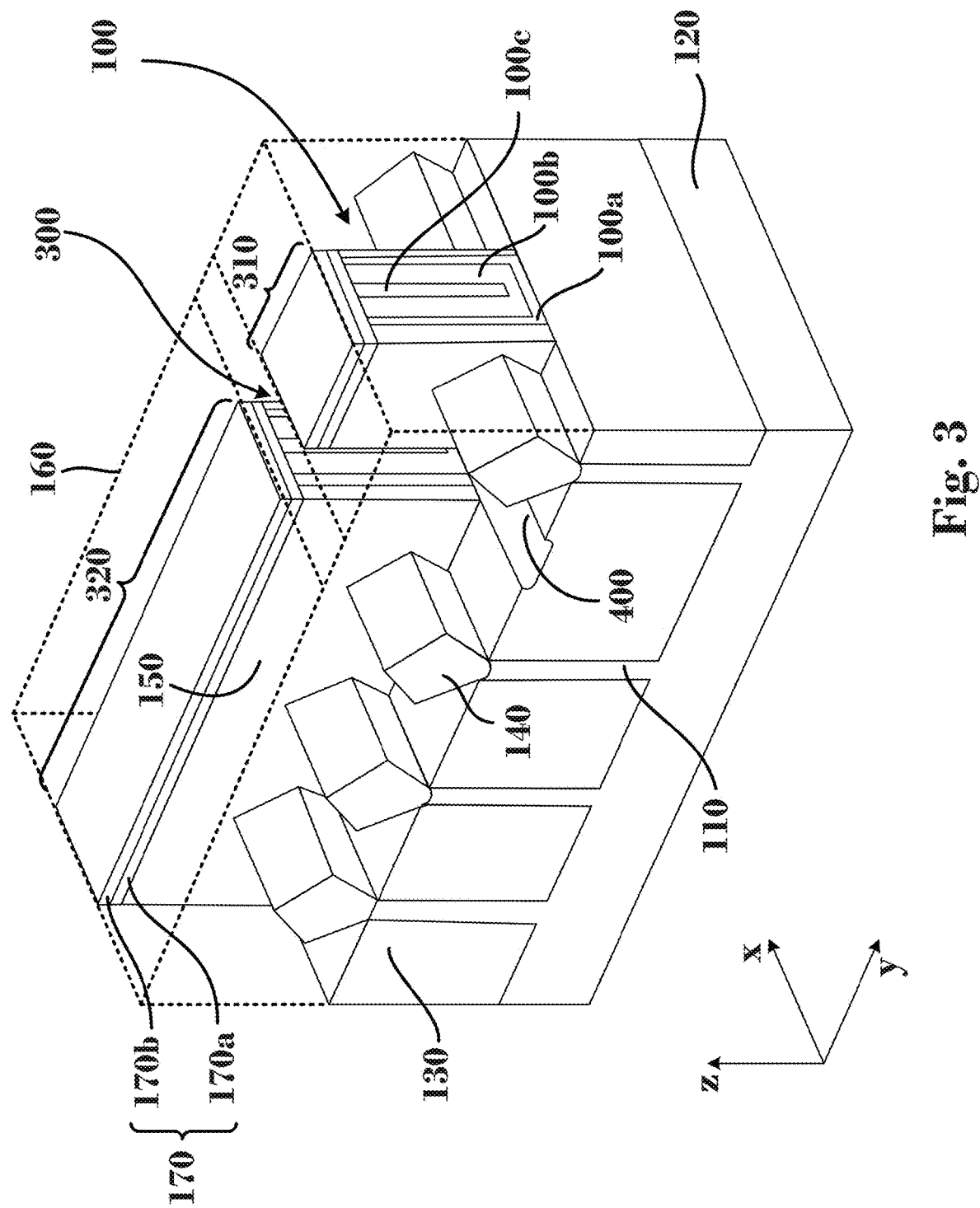
FIGS. 3 and 4 are isometric views of a gate structure after the formation of a cut that separates a gate structure into two sections, in accordance with some embodiments.

In referring to FIG. 3, a cut 300 is created to divide gate structure 100 along the y-axis , according to some embodiments. This is done, for example, to form individual transistors, like transistor 310, and/or a series of transistors, like transistors 320, by utilizing sections of the same original gate structure 100. This practice provides better process control over other fabrication methods where a larger number of shorter gate structures are formed at once. By way of example and not limitation, forming cuts 300 can eliminate process related variability (e.g., during patterning, layer deposition, planarization, etc.) when multiple shorter gate structure are formed. Further, by dividing a long gate structure with one or more cuts (e.g., like cut 300) a large group of transistors can be formed from sections of the same original gate structure—which can reduce the performance variability across the transistors. In some embodiments, additional cuts, like cut 300, may be formed in gate structure 100 and/or to additional gate structures of the integrated circuit as necessary. These additional cuts are not shown in FIG. 3.

Figure 4:
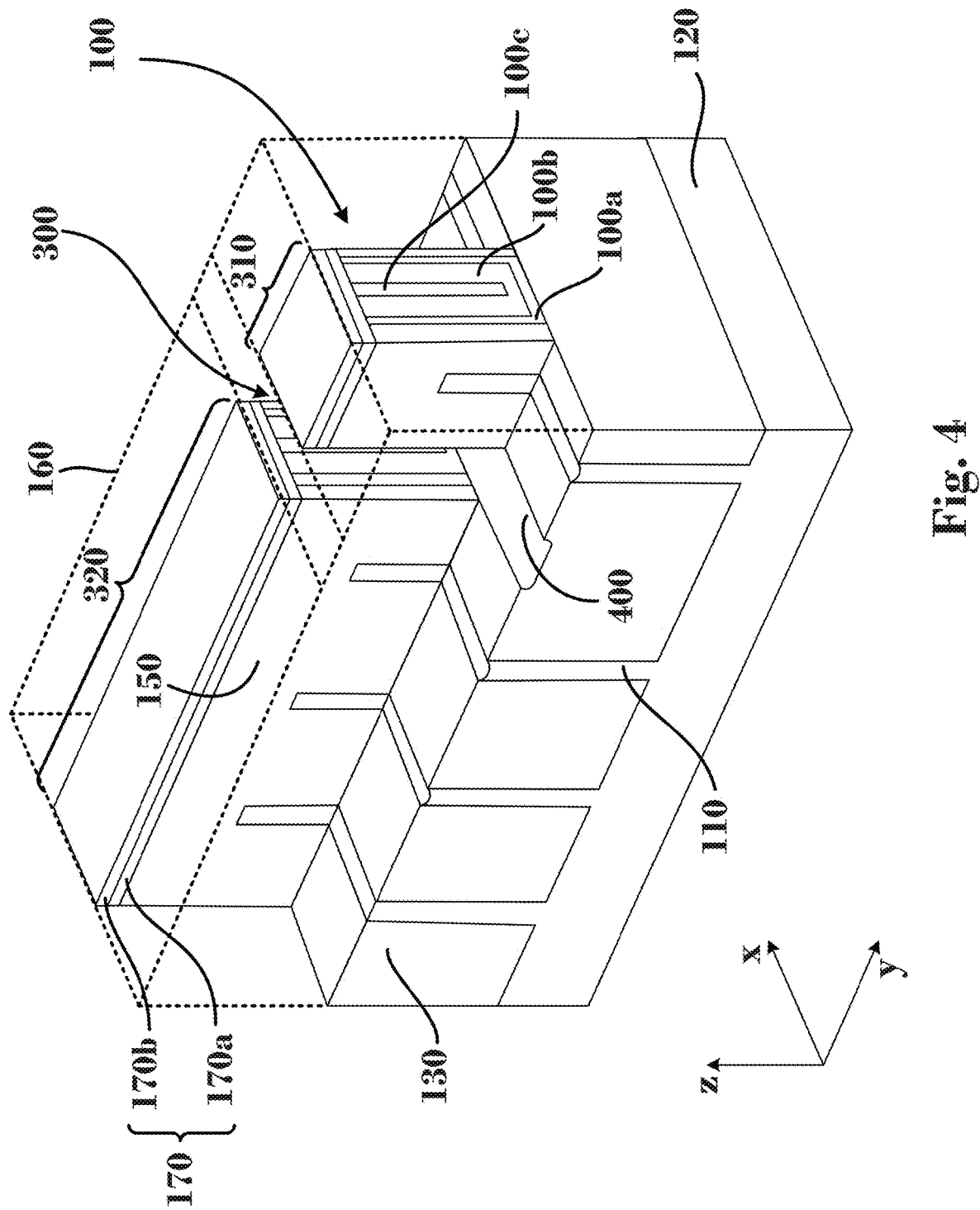

In some embodiments, cut 300 is designed to over etch dielectric layer 130 and form a recess 400 on its top surface as shown in FIG. 4. In some embodiments, FIG. 4 is similar to FIG. 3 with the exception that epitaxial structures 140 have been purposely omitted so that recess 400 is visible. In some embodiments, the depth of recess 400 measured from the top surface of dielectric layer 130 is between about 50 nm and about 100 nm. If the depth of recess 400 is greater than about 100 nm, the process time required to fill cut 300 will increase, which increases the fabrication cost. If the depth of recess 400 is less than about 50 nm, gate material may not be completely removed from the bottom of cut 300. As shown in FIGS. 3 and 4, cut 300 is formed as an "opening" in ILD 160 which exposes the top surface of dielectric layer 130 and the faces of gate structure 100. Consequently, dielectric stack 100a, work function stack 100b and metal fill 100c are exposed within cut 300. According to some embodiments, a silicon nitride liner is disposed in cut 300 to cover the faces of gate structure 100 and protect the exposed layers of gate structure 100. In some embodiments, the silicon nitride liner acts as a barrier that prevents oxygen diffusion into the layers of gate structure 100 (e.g., dielectric stack 100a. and work function stack 100b). Sources of oxygen species are, for example, the oxide layers in the vicinity of gate structure 100. Oxygen diffusion is undesirable since it causes unintentional and uncontrollable threshold voltage shifts in the fabricated transistors.

Figure 5:
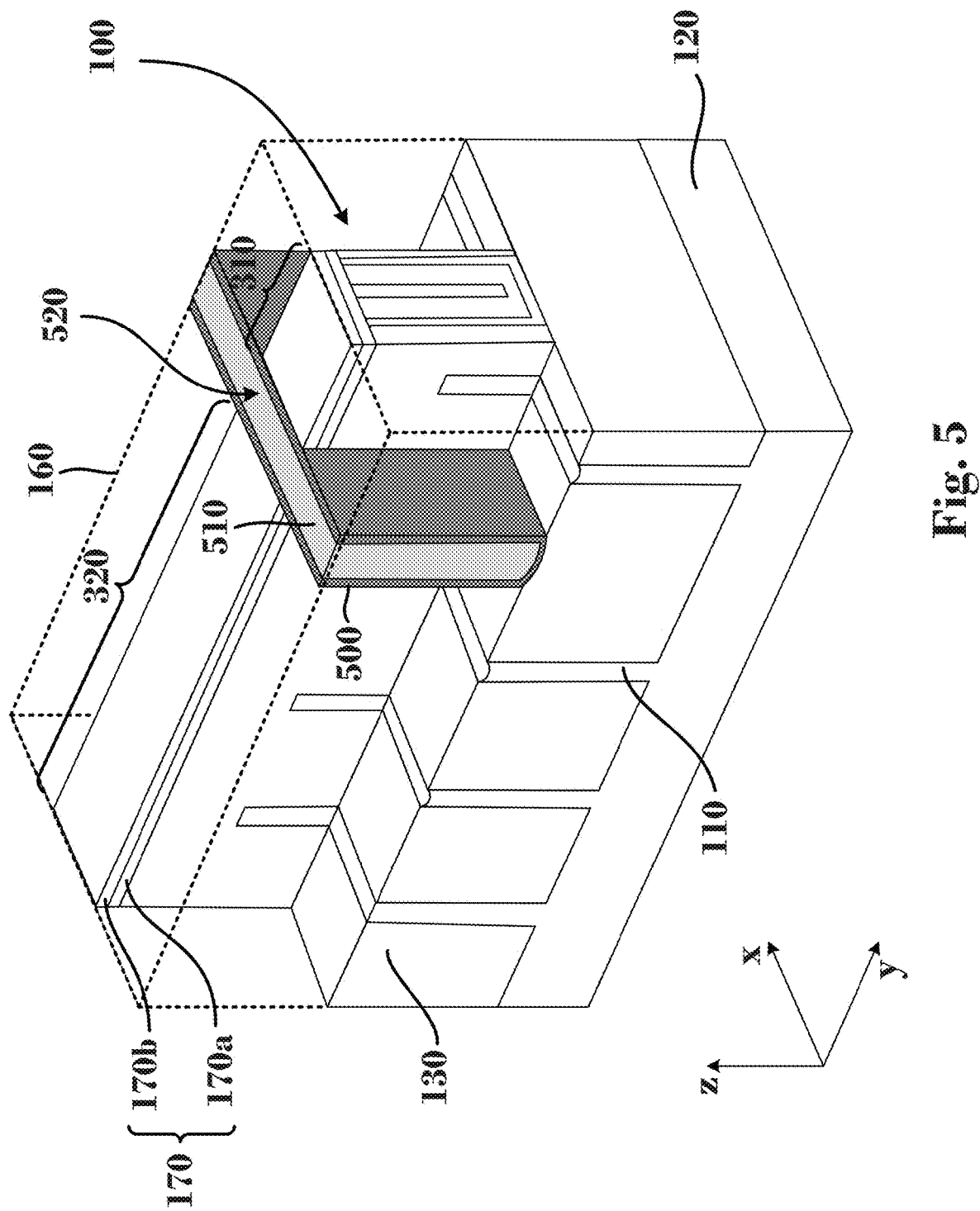
FIG. 5 is an isometric view of a fill structure disposed within a cut that separates a gate structure into two sections, in accordance with some embodiments.

According to some embodiments, an oxide layer is subsequently deposited on the silicon nitride liner to fill cut 300 FIG. 5 shows the final structure where silicon nitride liner 500 and oxide fill 510 are formed to fill cut 300 between transistor 310 and transistors 320. As discussed above, additional cuts (not shown) can be similarly filled with silicon nitride liner 500 and oxide fill 510. In some embodiments, silicon nitride liner 500 and oxide fill 510 collectively form fill structure 520.

In some embodiments, fill structure 520 provides several benefits. For example, fill structure 520 protects the faces of gate structure 100 after the formation of cut 300. Further, since oxide fill 510 has a lower dielectric constant (e.g., about 3.9) than silicon nitride liner 500 (e.g., about 7.4), the resulting fill structure 520 has a combined dielectric constant (k-value) that is closer to the dielectric constant of oxide fill 510. This is achieved because the volume occupied by oxide fill 510 in fill structure 520 is larger than that of silicon nitride liner 500. Therefore, the impact on the fringing capacitance from fill structure 520 is reduced compared to a fill structure having silicon nitride as the only fill material. In some embodiments, the thinner silicon nitride liner 500, the lower the dielectric constant of the resulting fill structure 520. In other words, the larger the volume oxide fill 510 occupies in fill structure 520 at the expense of nitride liner 500, the lower the combined dielectric constant (k-value) of fill structure 520. However, nitride liner 500 is required to have sufficient thickness to prevent oxygen diffusion into the layers of gate structure 100. In some embodiments, silicon nitride liner 500 has a thickness of about 5 nm and oxide fill 510 has a thickness of about 25 nm or alternatively a sufficient thickness to fill cut 300. Silicon nitride liners thinner than 5 nm may not adequately block oxygen diffusion, which can result in threshold voltage shifts in the transistors. On the other hand, silicon nitride liners thicker than about 5 nm sufficiently blocks oxygen diffusion, but at the same time increases the dielectric constant of fill structure 520 and the fringing capacitance. In some embodiments, a thickness ratio between silicon nitride liner 500 and oxide fill 510 in cut 300 can be between about 1:5 and about 1:9.

Figure 6:
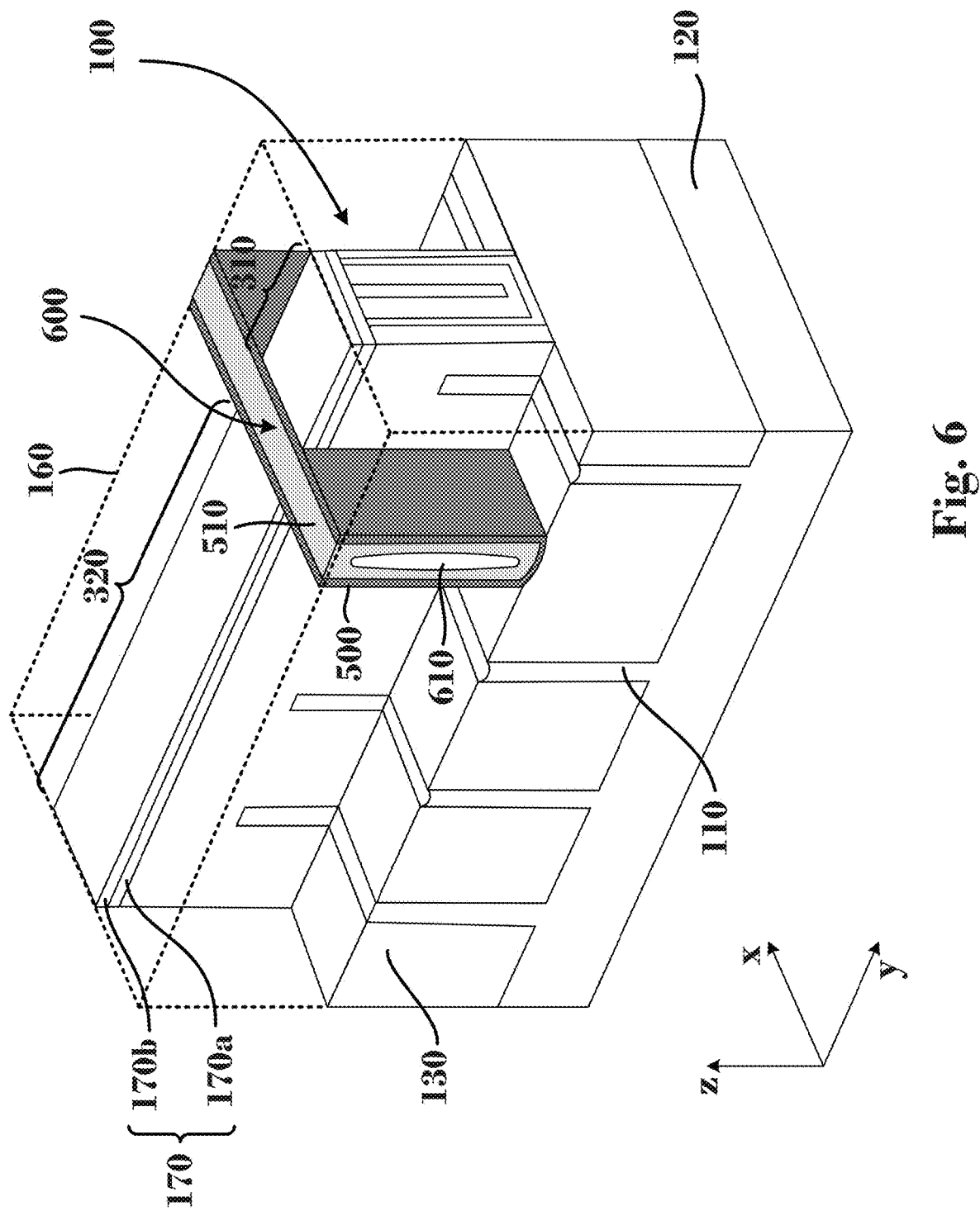
FIG. 6 is an isometric view of a fill structure with a seam disposed within a cut that separates a gate structure into two sections, in accordance with some embodiments.

In some embodiments, the combined dielectric constant (k-value) of fill structure 520 can be further reduced when an air-gap or a seam is formed in oxide fill 510. This is because air has a dielectric constant of about 1, which is lower than the dielectric constant of both oxide fill 510 and silicon nitride liner 500. In some embodiments, the larger the air-gap in oxide fill 510, the lower the dielectric constant of fill structure 520. By way of example and not limitation, FIG. 6 shows a fill structure 600 with an air-gap (or seam) 610 formed in oxide fill 510. In some embodiments, air-gap 610 is formed during the deposition of oxide fill 510 by adjusting, for example, the deposition rate of oxide fill 510 and/or the profile geometry of cut 300. In some embodiments, air-gap 610 is located below the top surface of gate structure 100 to prevent slurry from entering air-gap 610 during a subsequent planarization process. Slurry in the air-gap can corrode oxide fill 510 and silicon nitride liner 500 (e.g., remove oxide fill 510 and silicon nitride liner 500) and reach the layers of gate structure 100, which is undesirable. In some embodiments, intentionally introducing air-gaps or seams in oxide fill 510 is desirable as means to reduce the dielectric constant of fill structure 520 and the fringing capacitances. In some embodiments, the introduced air-gaps or seams 610 in oxide fill 510 have a width along the y-axis between 0 nm and about 3 nm.

Figure 7:
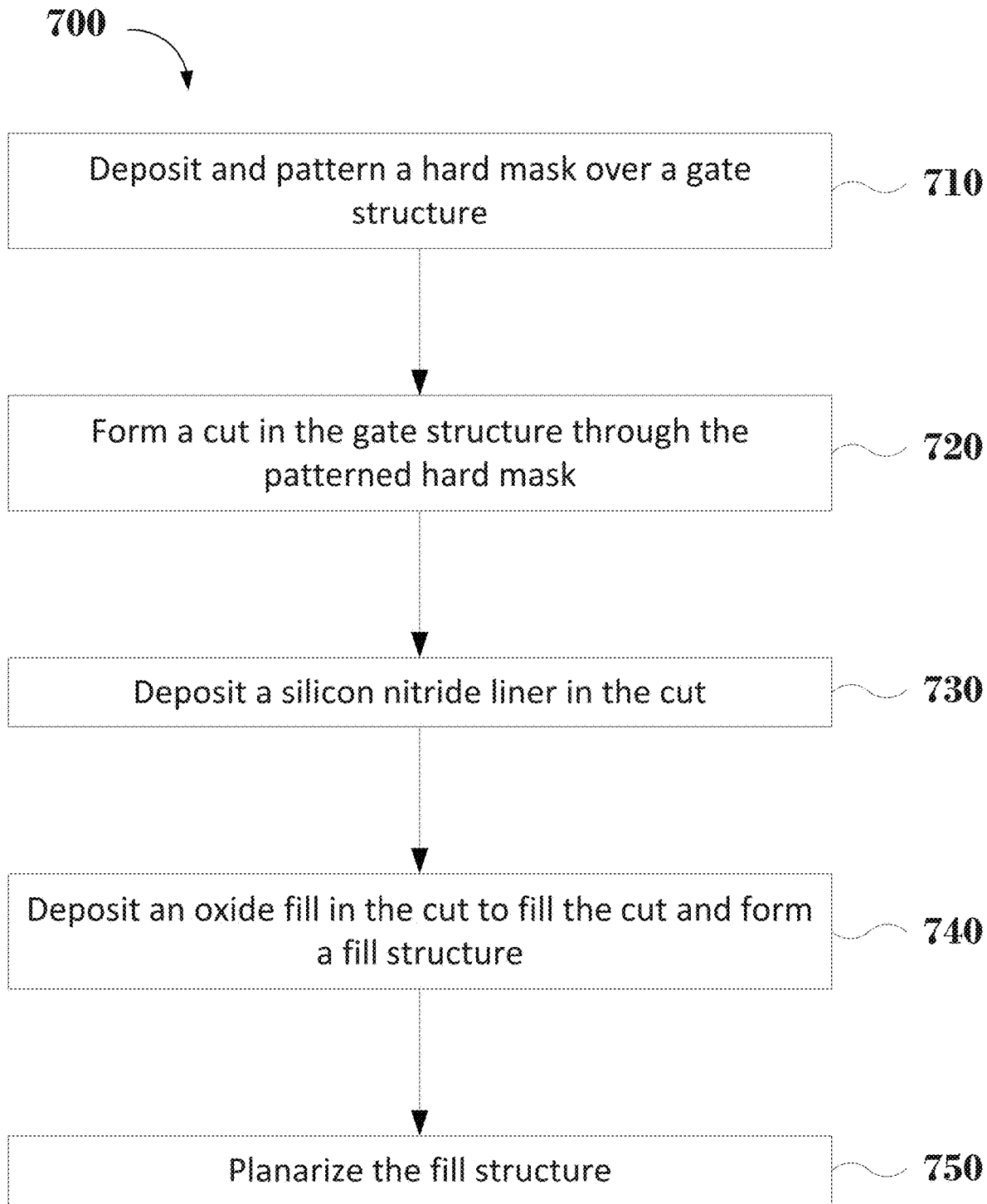
FIG. 7 is a flow chart of a method for the formation of a fill structure within a cut that separates a gate structure into two sections, in accordance with some embodiments.

FIG. 7 is a flow chart of a fabrication method 700 describing the formation process of fill structures having a silicon nitride liner, an oxide fill, and an optional air-gap or seam according to some embodiments. Other fabrication operations may be performed between the various operations of method 700 and may be omitted merely for clarity and ease of description. These various operations are within the spirit and the scope of this disclosure. Moreover, not all operations may be required to perform the disclosure provided herein. Additionally, some of the operations may be performed simultaneously, or in a different order than the ones shown in FIG. 7. In some embodiments, one or more other operations may be performed in addition to or in place of the presently described operations. For illustrative purposes, method 700 will be described with reference to the embodiments shown in FIGS. 1-6 and 8-14. The figures provided to describe method 700 are for illustrative purposes only and are not to scale. In addition, the figures may not reflect the actual geometry of the real structures, features, or films. Some structures, films, or geometries may have been deliberately augmented for illustrative purposes.

In referring to FIG. 7, method 700 begins with operation 710 and the process of depositing and patterning a hard mask over a gate structure. For example, as shown in FIGS. 8A and 8B—which are respectively cross-sectional views of FIG. 1 along lines A-B and C-D—a hard mask 800 is formed and patterned so that openings 810 are formed within the hard mask material. In some embodiments, FIG. 8A is a cross section along the direction of gate structure 100, and is therefore referred to as "y-cut." Respectively, FIG. 8B is a cross section along a direction parallel to fin structure 110, and is referred to as "x-cut." In some embodiments, hard mask 800 is a photoresist material, which is spin-coated on the structures of substrate 120 and then patterned. In some embodiments, hard mask 800 is a silicon nitride layer, or any other suitable material that can act as an etch mask and prevent masked regions of gate structure 100 and ILD 160 from being etched.

By way of example and not limitation, opening 810 can have sloped sidewalls 810s along the direction of gate structure 100 (e.g., along the y-axis) as shown in FIG. 8B and substantially vertical sidewalk along the direction of fin structures 110 (e.g., along the x-axis) as shown in FIG. 8A. In some embodiments, opening 810 exposes the top surface of hard mask layer 170 e.g., top silicon nitride 170b. It is noted, that opening 810 also extends over ILD 160. In other words, portions of ILD 160 are exposed by opening 810 as shown in FIG. 8B and isometric views shown in FIGS. 3 and 4.

Figures 9A, 9B:
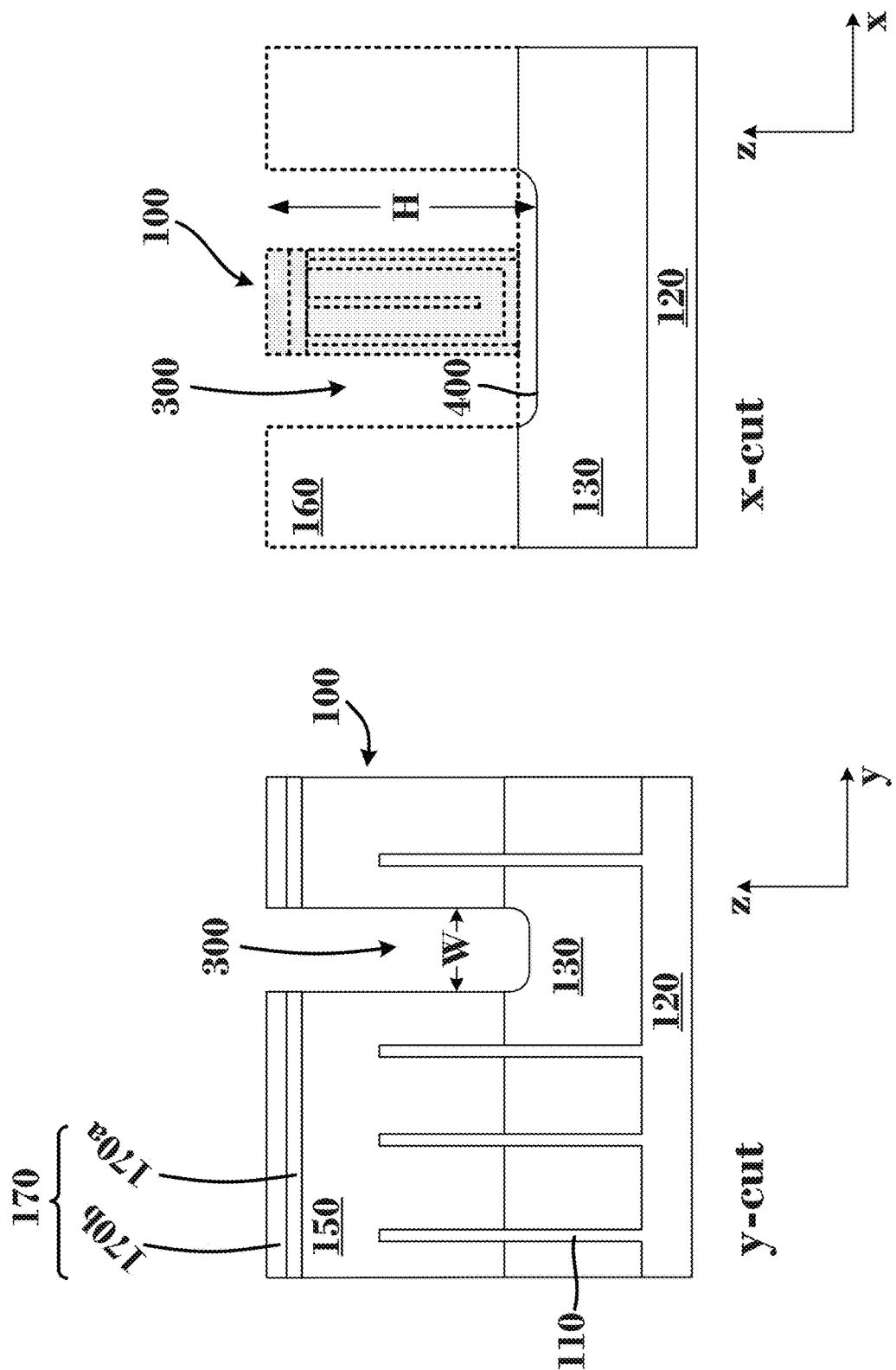
Figure 9C:
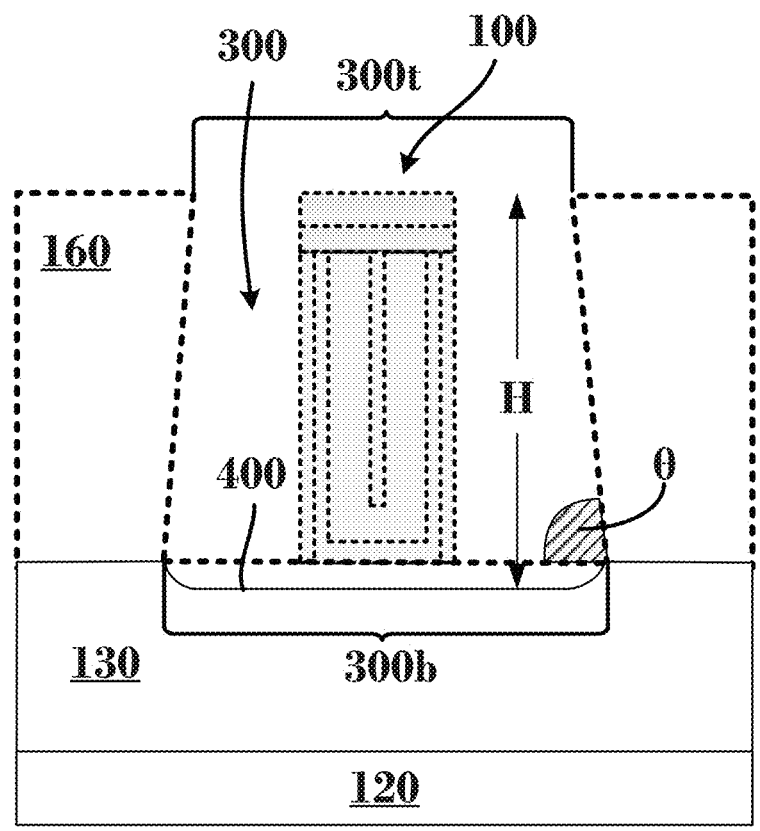

In referring to FIG. 7, method 700 continues with operation 720 and the process of forming a cut in the gate structure through the patterned hard mask, like cut 300 shown in FIGS. 3 and 4. FIGS. 9A and 9B show respectively cross sectional views along the y- and x-axes. In FIG. 9B, the face of gate structure 100 forming transistors 320 shown in FIGS. 3 and 4 is visible in the background through cut 300. In some embodiments, cut 300 is formed via dry etching. The etching process may include several etching operations with each having appropriate etching gas chemistries. In some embodiments, the dry etching process used for the formation of cut 300 is an anisotropic etching process. Consequently, cut 300 may have substantially vertical sidewalls. However, this is not limiting and cut 300 may have sidewalk with a negative slope as shown in FIG. 9C. In some embodiments, sidewalls with a negative slope may be formed only along the y-axis e.g. in a direction parallel to gate structure 100. Further details on the sloped sidewalk will be discussed below with respect to operation 740 of method 700.

According to some embodiments, the etching process is configured to remove exposed portions of hard mask layer 170, exposed portions of gate structure 100, and exposed portions of ILD 160. In some embodiments, once gate structure 100 and fLD 160 have been removed, the etching process etches exposed portions of dielectric layer 130 to form recess 400 on the top surface of dielectric layer 130 as discussed above. In some embodiments, cut 300 has a height H that ranges between about 140 nm and about 190 nm and a width W along the y-axis that ranges between about 18 nm and about 24 nm. In some embodiments, width W is the separation or gap formed between the section of gate structure 100 forming transistor 310 and the section of gate structure 100 forming transistors 320 shown in the isometric views of FIGS. 3 and 4. In some embodiments, the aspect ratio (H/W) of cut 300 ranges from about 8 to about 1. In some embodiments, if cut 300 is wider than about 24 nm, the performance of transistor 310 and transistors 320 will be adversely impacted. Further, if cut 300 is shorter than about 140 nm, the depth of recess 400 can be challenging to control.

Figures 10A, 10B:
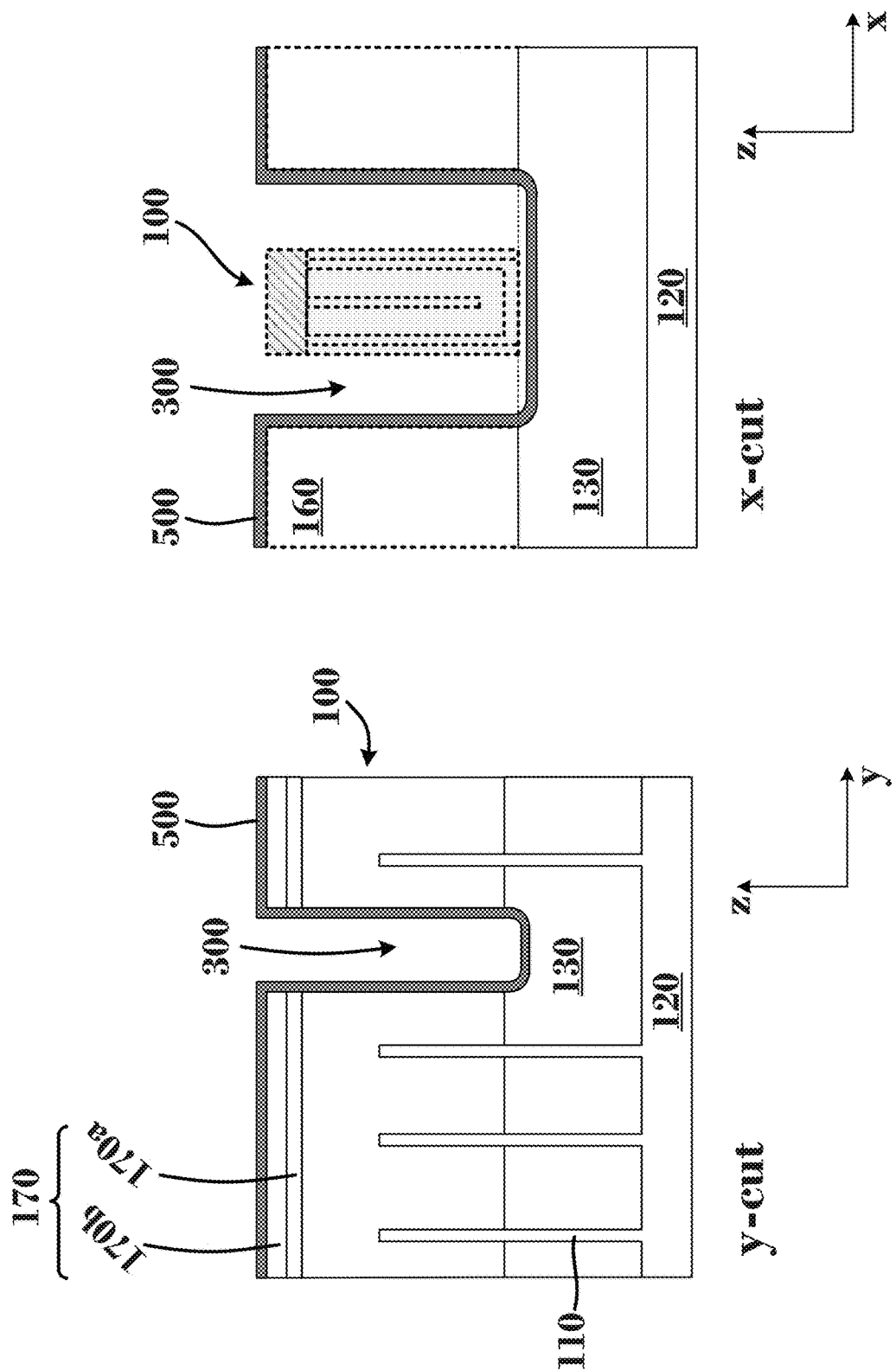

In referring to FIG. 7, method 700 continues with operation 730 and the process of depositing a silicon nitride liner, like silicon nitride liner 500 shown in FIGS. 5 and 6, in cut 300. In some embodiments, FIG. 10A and 10B show liner 500 deposited in cut 300 as viewed respectively along the y- and x-axes. In some embodiments, silicon nitride liner 500 is deposited at a temperature between about 300° C. and about 500° C. at a process pressure between about 10 Torr and about 30 Torr by a conformal process, such as an atomic layer deposition (ALD) process, at a thickness of about 5 nm. As discussed above, silicon nitride liner 500 is required to have sufficient thickness to prevent oxygen diffusion into gate structure 100. Silicon nitride liners thinner than 5 nm may not adequately block oxygen diffusion, which can result in threshold voltage shifts in the transistors. On the other hand, silicon nitride liners thicker than 5 nm can sufficiently block oxygen diffusion but would also increase the dielectric constant of the fill structure and the fringing capacitance. As shown in FIG. 10A and 10B, and previously in the isometric view of FIG. 5, silicon nitride liner 500 does not fill cut 300 and sufficiently covers exposed faces of gate structures 100. In some embodiments, cracks or thin sections of silicon nitride liner 500 (e.g., thinner than about 5nm) may become oxygen diffusion weak points. By way of example and not limitation, weak point locations can be hard to fill geometries such as corners, cavities, crevices, and/or the bottom portion of cut 300. For at least this reason, it is important that silicon nitride liner 500 is deposited with a process that can produce conformal films, such as an ALD-based process.

Figures 11A, 11B:
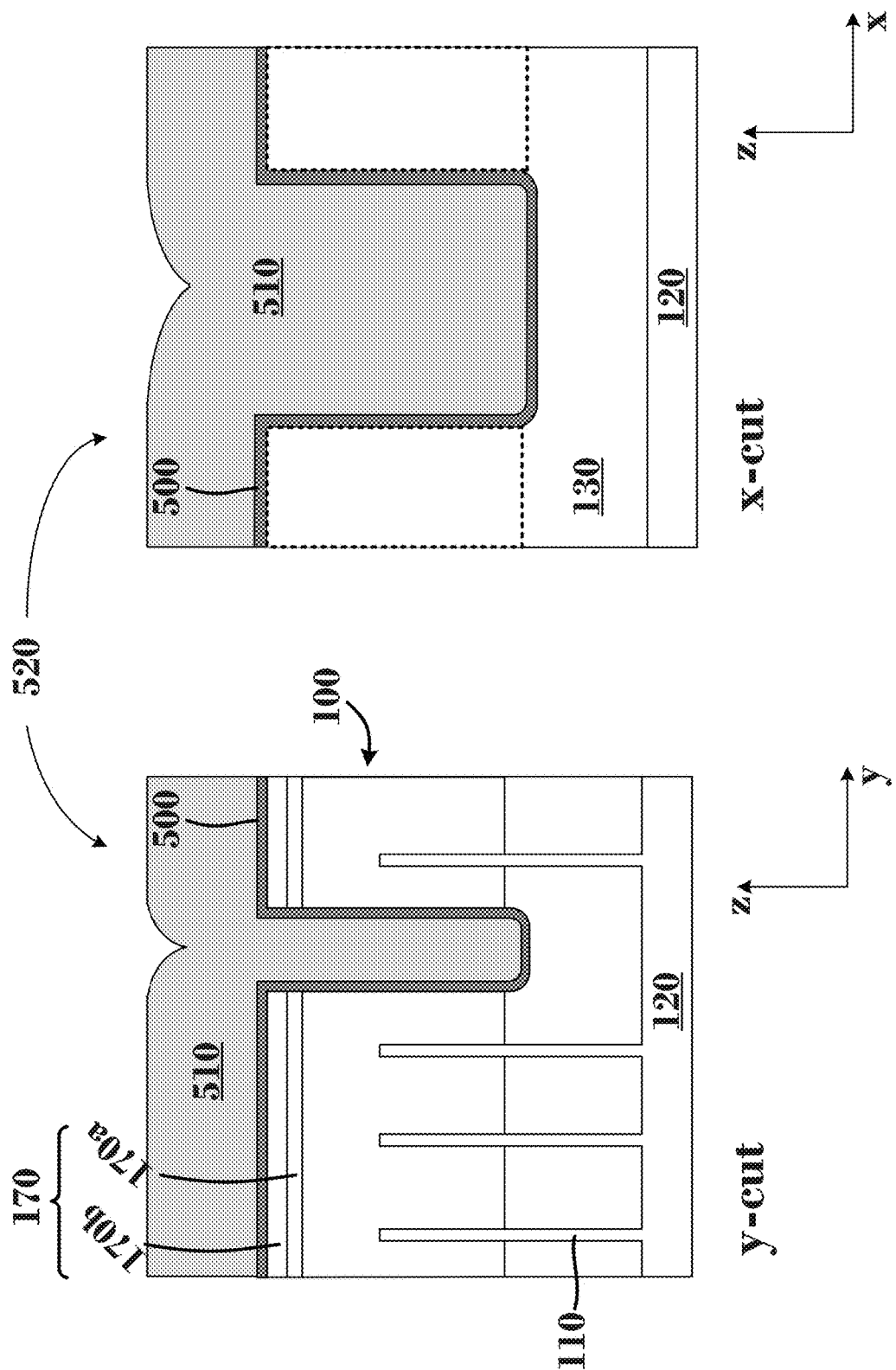

In referring to FIG. 7, method 700 continues with operation 740 and the process of depositing an oxide fill, such as oxide fill 510 shown in the isometric view of FIG. 5, in cut 300. In some embodiments, FIG. 11A and 11B show oxide fill deposited in cut 300 as viewed respectively along the y- and x-axes. In some embodiments, oxide fill 510 is deposited with a plasma-assisted process, such as plasma-assisted ALD (PEALD) process to a thickness that sufficiently fills cut 300—for example, about 25 nm. In some embodiments, oxide fill 510 is deposited at a lower temperature than silicon nitride liner 500 (e.g., between about 100° C. and about 300° C.) and at a higher process pressure (e.g., between about 1000 Torr and about 5000 Torr). In some embodiments, the deposition rate of oxide fill 510 can be adjusted primarily through the power applied to the plasma during deposition, which ranges between about 15 Watts and 500 Watts. In some embodiments, a low plasma power setting (e.g., closer to 15 Watts) produces a higher deposition rate compared to a higher plasma power setting (e.g., closer to about 500 Watts). The process temperature and pressure can also be used to adjust the deposition rate of oxide fill however, the degree of adjustment achieved with the aforementioned process parameters can be limited compared to the adjustment achieved with the plasma power setting. In other words, the deposition rate of oxide fill 510 is more sensitive to the plasma power setting than to the process temperature and/or pressure. As discussed above with respect to FIGS. 5, 11A, and 11B, silicon nitride liner 500 and oxide fill 510 collectively form fill structure 520. In some embodiments, oxide till 510 includes silicon oxide ($SiO_2$) having a dielectric constant of about 3.9 or a silicon oxide based dielectric such as silicon oxy-carbide (SiOC) having a dielectric constant of about 2.6.

In some embodiments, the deposition rate of oxide fill 510 can be used to form an optional seam or air-gap in oxide fill 510. For example, higher deposition rates can form a premature "necking" at the opening of cut 300, which subsequently limits the delivery of reactants at the bottom of cut 300. Consequently, the top of cut 300 "seals up" before cut 300 is filled with oxide fill 510. The effect can be assisted or exacerbated by changing the profile geometry of cut 300 e.g., by creating a re-entrant top profile for cut 300. By way of example and not limitation, the etch process responsible for the formation of cut 300 can be adjusted to form the sidewalls of cut 300 with a negative slope as shown in the x-cut of FIG. 9C. For example, a negative slope is formed when a sidewall angle θ of cut 300 is less than about 90° so that top opening 300t is shorter than bottom opening 300b (e.g., 300t <300b). In some embodiments, the aforementioned profile geometry of cut 300 corresponds to the x-z plane shown in the isometric view of FIG. 5. This is because a profile change in the y-cut direction—e.g., on the y-z plane—would affect the slope of the faces of gate structures 100, which may impact the reliability and electrical performance of the fabricated transistors. By way of example and not limitations, the bottom corners of cut 300 may be chamfered (e.g., rounded) as a result of the etch process used to form cut 300.

In some embodiments, the deposition rate of oxide fill 510 alone or in combination with the profile geometry for cut 300 may be used to form a seam or an air-gap within oxide fill 510 in a controlled and reproducible manner. By way of example and not limitation, isometric view shown in FIGS. 6 and cross sectional views shown in FIGS. 12A and 12B show an optional air-gap or seam 610 formed within oxide fill 510 in fill structure 600. As discussed above, air-gap or seam 610 can be formed by tuning (i) the deposition rate of oxide fill 510, (ii) the profile geometry of opening 300, or (iii) both. It is noted, that the position of seam or air-gap 610 needs to be below the top surface of gate structure 100 to prevent exposing air-gap 610 during a subsequent planarization process. As discussed above, air-gap or seam 610 can be between 0 nm to about 3 nm wide along the y-direction. Wider air-gaps or seams (e.g., wider than about 3 nm) increase the chances of exposing air-gap or seam 610 during a subsequent planarization process, which is undesirable.

Figure 14:
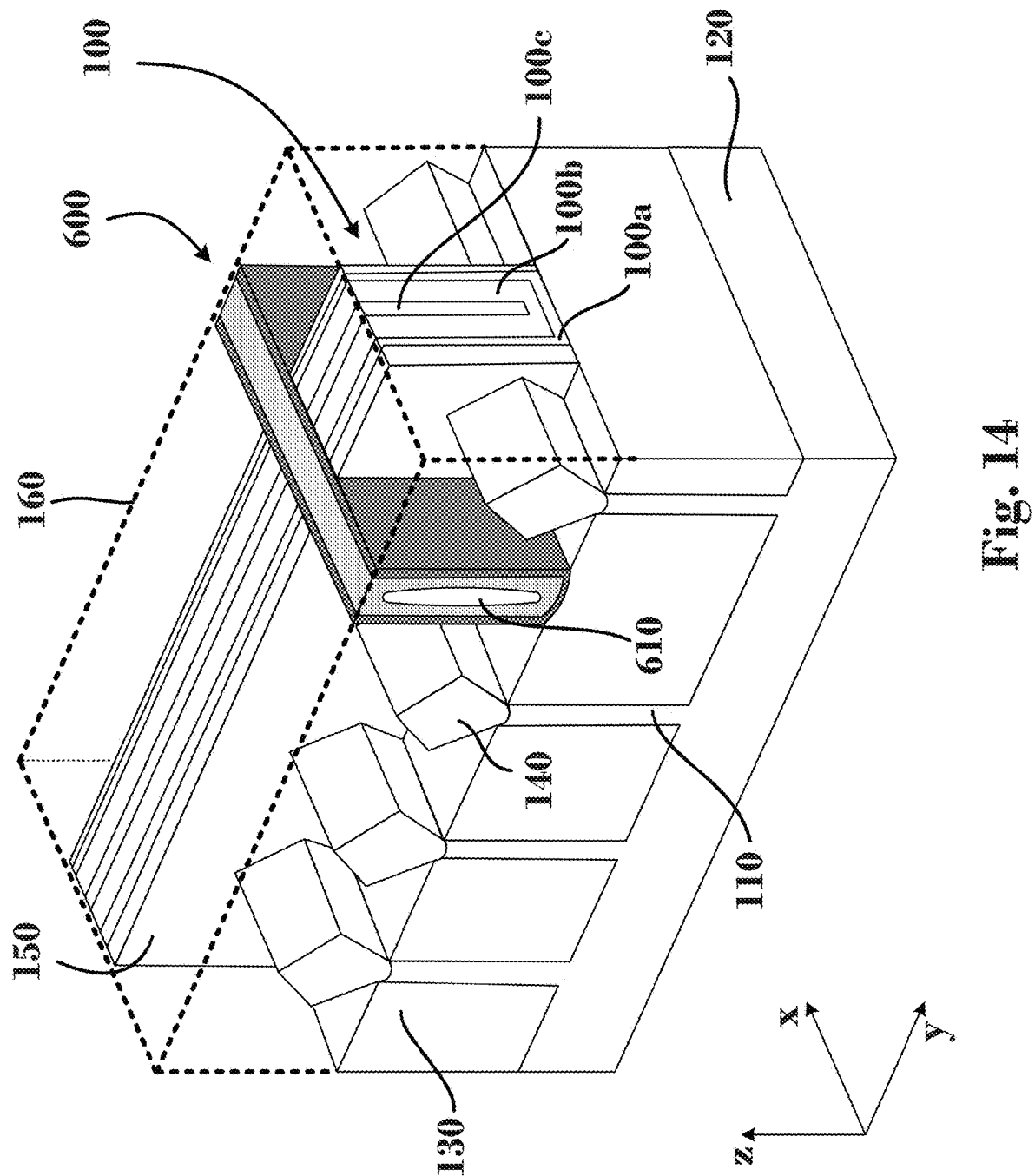
FIG. 14 is an isometric view of a fill structure with a seam disposed within a cut that separates a gate structure into two sections, in accordance with some embodiments.

In referring to FIG. 7, method 700 continues with operation 750 and the process of planarizing fill structure 520 or fill structure 600 shown in FIGS. 11A-B and 12A-B respectively. In some embodiments, the planarization process includes a chemical mechanical polishing (CMP) process that removes oxide fill 510, silicon nitride liner 500, and hard mask layer 170 from the top surface of each section of gate structure 100 in some embodiments, a top portion of gate structure 100 is also removed during the aforementioned planarization process. In other words, the original height of gate structure 100 may be reduced by the planarization process of operation 750. By way of example and not limitation, the cross sectional views of FIGS. 13A-B and the isometric view of FIG. 14 show the resulting structure after the planarization process of operation 750. In some embodiments, more than one discrete (e.g., not joined) air-gaps or seams, like air-gap or seam 610, can be formed within oxide fill 510 as a result of method 700. For example, two or three discrete air-gaps or seams may be formed within oxide fill 510 along cut 300 in the x-direction.

As discussed above, air-gap or seam 610 needs to be positioned so that when the planarization process planarizes fill structure 600, air-gap or seam 610 is not exposed. If the planarization process exposes and opens air-gap 610, slurry from the planarization process can enter the air-gap and begin corroding oxide fill 510 and silicon nitride liner 500 within fill structure 600. In this case, air-gap 610 will be substantially enlarged in a non-controlled and reproducible manner. Further, as fill oxide 510 and silicon nitride liner 500 are being corroded, the slurry may reach gate structure 100 and proceed to "attack" dielectric stack 100a, work function stack 100b, and metal fill 100c. In addition, an exposed air-gap 610 can be unintentionally filled with material(s) from subsequent deposition processes, which can substantially increase the fringing capacitance and compromise the chip reliability.

The embodiments described herein are directed to a method for mitigating the fringing capacitances generated by patterned gate structures. In some embodiments, the fringing capacitance can be reduced by partially replacing the silicon nitride isolation material with a lower-k oxide. In some embodiments, the deposition of lower-k oxide or the profile of the cut can be adjusted respectively to allow the formation of a seam or air-gap within the lower-k oxide to further reduce the effective dielectric constant of the formed fill structure. In some embodiments, the dielectric stack is formed by first depositing a silicon nitride liner in the cut, followed by a silicon oxide or a silicon oxide based dielectric that fills the cut. In some embodiments, the silicon nitride liner has a thickness of about 5 nm and the oxide fill has a thickness of about 25 nm or thicker. In some embodiments, the silicon oxide or silicon oxide based fill material has a dielectric constant equal to or less than about 3.9, which can substantially reduce the combined dielectric constant of the fill structure (e.g., bring it closer to about 3.9). In some embodiments, the deposition rate of the oxide fill can be adjusted via the plasma power in a PEALD process used to deposit the oxide fill. In some embodiments, the higher the deposition rate of the oxide fill, the larger the formed seam or air-gap in the fill structure.

In some embodiments, a semiconductor structure includes first fin structures and second fin structures on a substrate; a first gate structure disposed on the first fin structures; and a second gate structure, spaced apart from the first gate structure, disposed on the second fin structures so that a first end portion of the first gate structure faces a second end portion of the second gate structure. The semiconductor structure further includes a fill structure interposed between the first and second end portions of the respective first and second gate structures. The fill structure includes a first layer on the first and second end portions and a second layer with a lower dielectric constant than the first layer filling a space between the first and second gate structures.

In some embodiments, a semiconductor structure includes a first gate structure disposed on first fin structures over a substrate and a second gate structure disposed on second fin structures over the substrate, where the second gate structure is spaced apart from the first gate structure so that a first end portion of the first gate structure faces a second end portion of the second gate structure. The semiconductor structure further includes a fill structure interposed between the first and second end portions of the respective first and second gate structures. The fill structure includes a nitride liner on the first and second end portions and an oxide fill having a seam. Additionally, the semiconductor structure includes an interlayer dielectric material surrounding the first gate structure, the second gate structure, and the fill structure.

In some embodiments, a method includes forming a gate structure on fin structures disposed on a substrate; forming an opening in the gate structure to divide the gate structure into a first section and a second section, where the first and second sections are spaced apart by the opening. The method also includes forming a fill structure in the opening, where forming the fill structure includes depositing a silicon nitride liner in the opening to cover sidewall surfaces of the opening and depositing silicon oxide on the silicon nitride liner.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventors), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate structure on fin structures disposed on a substrate;
    forming an opening of substantially constant width in the gate structure between two adjacent fin structures, to divide the gate structure into first and second sections spaced apart by the opening, wherein the opening has a height to width ratio of about 8:1, the width being in a direction perpendicular to a length of the fin structures and parallel to the substrate, and wherein forming the opening comprises forming a recess in a dielectric layer between the fin structures;
    depositing a silicon nitride liner in the opening to cover sidewall surfaces of the opening; and
    depositing a silicon oxide fill layer in the opening and on the silicon nitride liner, comprising forming an air gap within the silicon oxide fill layer.

2. The method of claim 1, wherein depositing the silicon nitride liner comprises conformally depositing the silicon nitride liner so that a thickness ratio between the silicon nitride liner and the silicon oxide fill layer ranges between about 1:5 and about 1:9.

3. The method of claim 1, wherein depositing the silicon oxide comprises depositing the silicon oxide fill layer with a plasma-assisted process at a deposition rate that is adjustable by a plasma power of the plasma-assisted process.

4. The method of claim 3, wherein depositing the silicon oxide fill layer comprises filling the opening with the silicon oxide fill layer.

5. The method of claim 1, wherein forming the air gap comprises adjusting a deposition rate of the silicon oxide.

6. The method of claim 1, wherein forming the opening comprises forming the opening with sidewalls having a negative slope along a plane parallel to a width of the gate structure.

7. The method of claim 1, wherein forming the air gap comprises forming the air gap having a width less than about 3 nm.

8. A method, comprising:
    forming a plurality of fin field effect transistors (finFETs) that share a gate structure;
    removing portions of the gate structure between adjacent fin structures of the plurality of finFETs to form openings, wherein removing portions of the gate structure comprises forming a recess in a dielectric layer between the adjacent fin structures with a vertical depth between about 50 nm and about 100 nm below a top surface of the dielectric layer; and
    inserting, into the openings, an insulating material of substantially constant width that electrically isolates the finFETs from one another, wherein inserting the insulating material comprises forming an air gap in the insulating material occupying the opening.

9. The method of claim 8, wherein the gate structure is a metal gate structure, and wherein removing portions of the gate structure comprises forming a cut between the adjacent fin structures of the plurality finFETs.

10. The method of claim 8, wherein depositing the one or more dielectric materials comprises depositing one or more of a silicon nitride, a silicon oxide, and a silicon oxy-carbide.

11. The method of claim 10, wherein depositing the one or more dielectric materials comprises depositing the silicon nitride and the silicon oxide so that a thickness ratio between the silicon nitride and the silicon oxide ranges between about 1:5 and about 1:9.

12. The method of claim 8, further comprising planarizing a surface of the insulating material using a chemical mechanical polishing (CMP) process.

13. The method of claim 12, wherein forming the air gap occurs below a top surface of the gate structure to prevent exposure of the air gap during the CMP process.

14. A method of producing transistors, the method comprising:
    forming a plurality of fin structures on a semiconductor substrate;
    forming a metal gate structure that wraps around each of the plurality of fin structures; and
    replacing portions of the metal gate structure with a low-k dielectric material to electrically isolate the plurality of fin structures from one another, wherein replacing portions of the metal gate structure comprises:
        cutting the metal gate structure between, and substantially parallel to, adjacent fin structures in the plurality of fin structures to form cuts with a height to width ratio of about 8:1, the width being in a direction perpendicular to a length of the fin structures and parallel to the semiconductor substrate, wherein the cutting comprises forming a recess in a dielectric layer between fin structures in the plurality of fin structures;
        depositing, into the cuts, a multi-layer dielectric stack of substantially constant width, comprising a silicon nitride liner and silicon oxide; and
        forming an air gap in the multi-layer dielectric stack within the cuts.

15. The method of claim 14, wherein replacing portions of the metal gate structure comprises filling the metal gate structure with a silicon oxide based dielectric fill material.

16. The method of claim 14, wherein depositing the multi-layer dielectric stack comprises conformally depositing the multi-layer dielectric to facilitate the formation of the air gap.

17. The method of claim 14, wherein forming the air gap comprises reducing an effective dielectric constant of the multi-layer dielectric stack to less than about 3.9.

18. The method of claim 14, wherein cutting the metal gate structure comprises forming a plurality of metal gates that are protected, by the cuts, from oxygen diffusion.

19. The method of claim 14, wherein cutting the metal gate structure comprises recessing the dielectric layer disposed below the metal gate structure.

20. The method of claim 14, wherein cutting the metal gate structure forms cuts in a range of about 50 nm to about 100 nm.

* * * * *